(12) United States Patent
Boerstler et al.

(10) Patent No.: US 7,245,172 B2
(45) Date of Patent: Jul. 17, 2007

(54) LEVEL SHIFTER APPARATUS AND METHOD FOR MINIMIZING DUTY CYCLE DISTORTION

(75) Inventors: David W. Boerstler, Round Rock, TX (US); Eskinder Hailu, Austin, TX (US); Kazuhiko Miki, Round Rock, TX (US); Jieming Qi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 73 days.

(21) Appl. No.: 11/269,245

(22) Filed: Nov. 8, 2005

(65) Prior Publication Data

US 2007/0103215 A1    May 10, 2007

(51) Int. Cl.
*H03L 5/00* (2006.01)
(52) U.S. Cl. ........................................ 327/333; 326/81
(58) Field of Classification Search .................. 326/62, 326/63, 68, 80, 81; 327/333
See application file for complete search history.

(56) References Cited

U.S. PATENT DOCUMENTS

| | | | |
|---|---|---|---|
| 5,153,451 A | 10/1992 | Yamamura et al. | |
| 5,450,357 A | 9/1995 | Coffman | |
| 5,627,489 A | 5/1997 | Jochum | |
| 5,689,460 A * | 11/1997 | Ooishi | 365/189.07 |
| 6,040,718 A * | 3/2000 | Henry | 327/71 |
| 6,768,368 B2 | 7/2004 | Kaneko et al. | |
| 6,788,125 B1 | 9/2004 | Tomsio | |
| 6,819,159 B1 | 11/2004 | Lencioni | |
| 6,922,085 B2 * | 7/2005 | Dreps et al. | 327/65 |
| 6,922,098 B2 * | 7/2005 | Choi et al. | 327/538 |
| 6,940,333 B2 | 9/2005 | Chiu et al. | |

(Continued)

FOREIGN PATENT DOCUMENTS

| | | |
|---|---|---|
| EP | 0817386 B1 | 7/2002 |
| JP | 2002190730 A2 | 5/2002 |

OTHER PUBLICATIONS

U.S. Appl. No. 11/171,756, filed Jun. 30, 2005, Hailu et al.

(Continued)

*Primary Examiner*—Tuan T. Lam
*Assistant Examiner*—William Hernandez
(74) *Attorney, Agent, or Firm*—Stephen J. Walder, Jr.; Diana R. Gerhardt (57) ABSTRACT

A level shifter apparatus and method for minimizing duty cycle distortion are provided. The level shifter includes a bank of comparators each having an associated threshold built into it. The comparators compare a difference in source voltages for two power domains to these built-in thresholds and output a signal indicative of whether the threshold is exceeded. The output signals from the comparators are provided to a thermometric decoder which generates control signals based on these output signals. The control signals are used to control stages in a level shifter for modifying the voltage output of the level shifter. Individual stages may be enabled to thereby monotonically modify the voltage output of the level shifter and thereby decrease a time required to achieve a voltage having a level that causes a state change in a driven circuit. As a result, duty cycle distortion is minimized and maximum operational frequency is increased.

20 Claims, 5 Drawing Sheets

U.S. PATENT DOCUMENTS

2002/0083352 A1  6/2002  Fujimoto et al.
2003/0222699 A1  12/2003  Carpenter et al.
2004/0246038 A1  12/2004  Bucossi

OTHER PUBLICATIONS

U.S. Appl. No. 11/242,670, filed Oct. 3, 2005, Boerstler et al.
U.S. Appl. No. 11/260,570, filed Oct. 27, 2005, Boerstler et al.

* cited by examiner

LEVEL SHIFTER APPARATUS AND METHOD FOR MINIMIZING DUTY CYCLE DISTORTION

BACKGROUND

1. Technical Field

The present application relates generally to an improved integrated circuit apparatus and method. More specifically, the present application is directed to a level shifter apparatus and method for minimizing duty cycle distortion.

2. Description of Related Art

Level shifters are integral components of any circuit that operates from different power supply boundaries. The level shifters act as the interfaces between these different power supply domains to send/receive signals across these boundaries. However, the voltage mismatch between the two power domains may cause severe duty cycle errors if simple receivers are used for level shifting. This error gets worse as the mismatch in the power supply voltages between the two domains gets larger. To appreciate this, a simple explanation of how a simple level shifter works is provided below.

Figure 1:
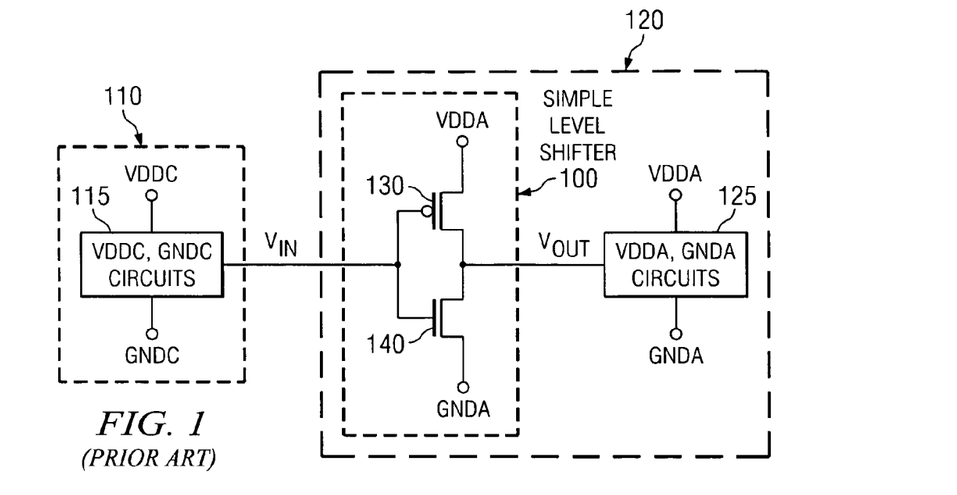
FIG. 1 is an exemplary diagram of a known level shifter circuit.

FIG. 1 illustrates a simple level shifter in accordance with a known implementation. The level shifter shown in FIG. 1 operates as an inverter. The voltage input $V_{IN}$ to the level shifter 100 comes from a first power domain 110, having voltage source VDDC and ground GNDC, and circuits 115 operating based on voltage source VDDC and ground GNDC. The level shifter 100 itself resides in a second power domain 120, having voltage source VDDA and ground GNDA. It is assumed, for this explanation that GNDC=GNDA=gnd. The main failure mechanism in such a level shifter 100 as shown in FIG. 1 is the mismatch in the drive strength between the pull-up PFET 130 and the pull down NFET 140.

Suppose that initially the output of the level shifter 100 is high (VDDA). The capacitance loading the output node of the level shifter, CL, is the loading due to the circuitry 125 being driven by the level shifter 100. It is assumed that the threshold voltage at which the circuitry 125 changes its state is called V_TRIP.

At time t0, the voltage input, $V_{IN}$, to the level shifter 100 changes from low to high (gnd to VDDC). At this instant, the maximum pull down current provided by the NFET 140 may be described as:

$$IN_{MAX} = K_N * (VDDC - VT_N)^\alpha \quad (1)$$

where $K_N$ is a transconductance parameter taking into account device size, mobility, etc., $VT_N$ is the NFET 140 threshold voltage, and $\alpha$ is a fitting parameter that may vary with process (e.g., doping, threshold voltage, mobility, gate oxide thickness etc. variations across a single wafer and across multiple wafers), as well as device length.

At t0, the maximum discharge current from CL is given by:

$$ICL_{max} = CL * (\delta Vout/\delta t)_{max} \quad (2)$$

where Vout is the output voltage of the level shifter. Assuming VDDA>VDDC, then the pull-up current still provided by the PFET 130 can be modeled as:

$$IP = f(VDDA - VDDC) \quad (3)$$

where f( ) is a monotonically increasing function of VDDA-VDDC. Hence, the larger VDDA-VDDC, the larger the pull-up current will be. Applying Kirkoff's current law to t0, one may write:

$$CL(\delta Vout/\delta t)_{MAX} = IN_{MAX} - f(VDDA - VDDC) \quad (4)$$

$$(\delta Vout/\delta t)_{MAX} = [IN_{MAX} - f(VDDA - VDDC)]/CL \quad (5)$$

Figure 2:
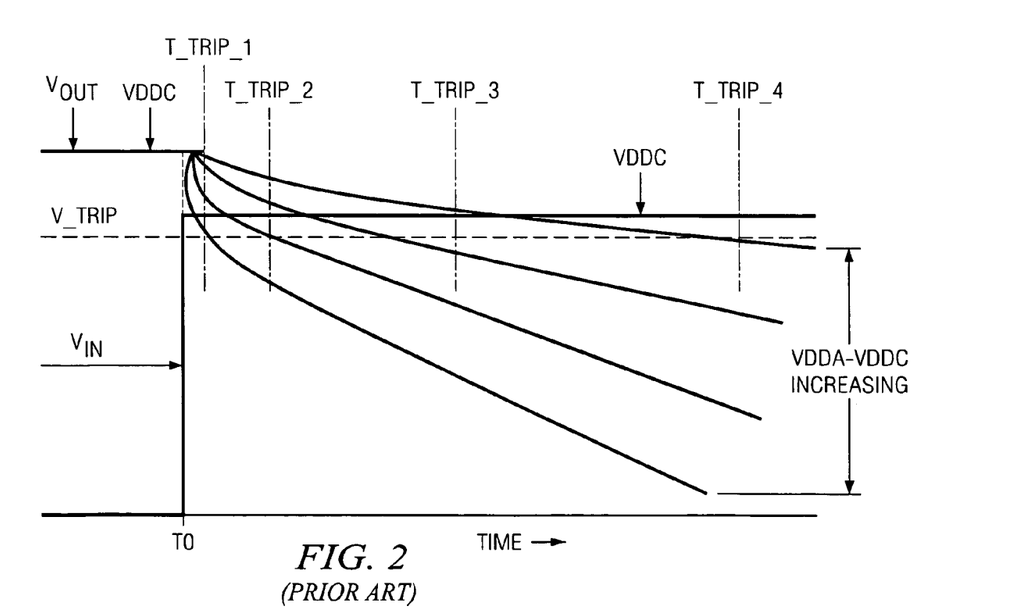
FIG. 2 is a diagram illustrating Vout versus time plots for various VDDA–VDDC settings.

FIG. 2 displays Vout versus time plots for various VDDA-VDDC settings. That is, FIG. 2 describes the time transient of Vout upon the instantaneous switch in state of the input VIN (from 0 to VDDC). The various traces for Vout correspond to various VDDA-VDDC values. The value of V_TRIP is also shown in FIG. 2.

It can be seen from FIG. 2 that for larger VDDA-VDDC settings, the $\delta Vout/\delta t$ gradient is reduced causing the amount of time it takes for Vout to reach V_TRIP to be increased. This time, labeled T_TRIP, can be used to directly compute the maximum frequency of operation of the level shifter for a given VDDA-VDDC setting:

$$FMAX < 1/(2 * T\_TRIP) \quad (6)$$

Thus, the increase in the T_TRIP value also reduces the maximum operating frequency of the level shifter.

In addition, T_TRIP can provide information about the duty cycle distortion introduced by this circuit. In the worst case where $IN_{MAX} = f(VDDA - VDDC)$, Vout will never discharge and the level shifter has become useless.

There are many level shifter circuits presently available, e.g., U.S. Pat. No. 6,940,333 describes as high-to-low level shifter in which an external signal switches between a high voltage domain high potential and a high voltage domain low potential while an internal signal switches between a low voltage domain high potential and a low voltage domain low potential. However, these known level shifter circuits do not address the issues arising due to high frequency operation.

SUMMARY

In view of the above, it would be beneficial to have a level shifter that can compensate for the duty cycle distortion as well as the limit on operating frequency introduced as a result of the VDDA-VDDC voltage mismatches. The illustrative embodiments provide such a level shifter mechanism for minimizing duty cycle distortion while achieving high operating frequency.

The level shifter mechanism of the illustrative embodiments comprises three main portions. In a first portion, a bank of N comparators are provided that take the VDDC and VDDA (or GNDC and GNDA) signals as their inputs. Each comparator has an associated threshold built into it. When the difference between VDDC and VDDA (or GNDC and GNDA) are above this threshold, the comparator changes state. The bank of comparators may have monotonically increasing levels of threshold built into the comparators such that a first comparator may have a first threshold while a second comparator has a second threshold greater than the first threshold.

The output of this bank of N comparators is input to a second main portion of the level shifter mechanism comprising a N-to-N thermometric decoder. The N-to-N thermometric decoder ensures that drive strengths of the level shifter pull-up/down devices are increased and/or decreased monotonically. The N-to-N thermometric decoder converts the N input signals generated by the bank of comparators into N switch control signals as well as helps to eliminate non-linearities arising from, for example, comparator mismatches and the like. These switch control signals are output to a level shifter, providing in a third main portion of the level shifter mechanism, and are used to turn on/off current branches in stages of the level shifter, thereby increasing/decreasing the drive strengths of the pull-up/down devices of the level shifter. That is, the outputs of the thermometric decoder may either close or open switches in a series of stages of the current branches of the level shifter to thereby cause the pull-up/down devices of those stages to operate on the output of the inverter of the level shifter. In this way, the drive strengths of the pull-up/down devices in the level shifter are either increased or decreased.

Thus, based on the voltage difference amount between the two power domains, pull-up/down devices in stages of a level shifter may be enabled to thereby boost or reduce the output voltage of the inverter in the level shifter. In so doing, the T_TRIP value for achieving an V_TRIP output voltage is reduced. Since T_TRIP is reduced by operation of the illustrative embodiments, the maximum frequency of operation of the circuit is increased (see equation 6 above).

A level shifter mechanism such as that of the illustrative embodiments may be especially well suited for applications where the VDDC/VDDA and GNDC/GNDA levels are either unknown or are arbitrarily being changed. In a well-controlled process, the comparator thresholds may be set a priori, for example, using electrical fuses (e-Fuses) or another type of storage device. The level shifter mechanism of the illustrative embodiments may be used in a wide variety of power supply environments.

In one illustrative embodiment, an apparatus is provided for minimizing duty cycle distortion. The apparatus may comprise at least one comparator that compares a difference between a source voltage of a first power domain and a source voltage of a second power domain, to at least one threshold built into the at least one comparator. The apparatus may further comprise a level shifter coupled to the at least one comparator. The level shifter may include an inverter and at least one stage that operates on a voltage output of the inverter when enabled. The at least one comparator may output at least one signal indicative of whether the at least one threshold is exceeded by the difference. The at least one signal may be used to control enabling of the at least one stage of the level shifter.

The apparatus may further comprise a thermometric decoder coupled to the at least one comparator and the level shifter. The thermometric decoder may decode the at least one signal from the at least one comparator and generate at least one control signal for controlling enabling of the at least one stage of the level shifter. The thermometric decoder may be an N-to-N thermometric decoder.

The at least one control signal may control at least one switch in the at least one stage of the level shifter to thereby either enable or disable the at least one stage. Each stage in the at least one stage of the level shifter may include a PFET device and a switch coupling the PFET device to the source voltage of the second power domain. Moreover, each stage in the at least one stage of the level shifter may include a NFET device and a switch coupling the NFET device to a ground of the second power domain. Alternatively, each stage in the at least one stage of the level shifter may include a PFET device and a first switch coupling the PFET device to the source voltage of the second power domain, and a NFET device and a second switch coupling the NFET device to a ground of the second power domain.

The at least one comparator may comprise a plurality of comparators. The thresholds built-in to the plurality of comparators may be monotonically increasing from a first threshold associated with a first comparator in the plurality of comparators to a last threshold associated with a last comparator in the plurality of comparators. The at least one stage may include at least one of a pull-up device or a pull-down device that, when enabled, drives the output voltage signal of the inverter to either increase or decrease, respectively, the output voltage signal. Each stage in the at least one stage may modify the output voltage signal of the inverter by a monotonically incremental amount.

The apparatus may be part of an integrated circuit device. The integrated circuit device may be part of a data processing system. The data processing system may be one of a toy, a game machine, a game console, a hand-held computing device, a personal digital assistant, a communication device, a wireless telephone, a laptop computing device, a desktop computing device, or a server computing device.

In another illustrative embodiment, a method for minimizing duty cycle distortion is provided. The method may be implemented in a data processing device and may comprise comparing, using at least one comparator, a difference between a source voltage of a first power domain and a source voltage of a second power domain, to at least one threshold. The method may further comprise controlling enabling of at least one stage in a level shifter coupled to the at least one comparator based on results of the comparing indicating that at least one threshold of the at least one threshold is exceeded by the difference. The level shifter may include an inverter and each stage in the at least one stage may operate on an output of the inverter when enabled. The data processing device may be part of a toy, a game machine, a game console, a hand-held computing device, a personal digital assistant, a communication device, a wireless telephone, a laptop computing device, a desktop computing device, or a server computing device.

The method may further comprise decoding signals output by the at least one comparator and generating at least one control signal for controlling enabling of the at least one stage of the level shifter. Controlling enabling of the at least one stage of the level shifter may comprise controlling at least one switch in the at least one stage of the level shifter to thereby either enable or disable the at least one stage.

The at least one comparator may comprise a plurality of comparators and the at least one threshold may comprise thresholds built-in to the plurality of comparators. The thresholds may be monotonically increasing from a first threshold associated with a first comparator in the plurality of comparators to a last threshold associated with a last comparator in the plurality of comparators. The at least one stage may include at least one of a pull-up device or a pull-down device that, when enabled, drives the output voltage signal of the inverter to either increase or decrease, respectively, an output voltage signal of the inverter. Each stage in the at least one stage may modify an output voltage signal of the inverter by a monotonically incremental amount.

These and other features and advantages of the present invention will be described in, or will become apparent to those of ordinary skill in the art in view of, the following detailed description of the illustrative embodiments.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENTS

The illustrative embodiments provide a level shifter mechanism for converting a first input voltage signal to a second output voltage signal while compensating for duty cycle distortion and increasing the maximum operating frequency of the circuit. The level shifter mechanism of the illustrative embodiments performs such compensation by enabling various pull-up/down devices of stages of a level shifter based on a determined difference between the voltages of the two power domains. The various pull-up/down devices of the stages of the level shifter are enabled such that a monotonically increasing pull-up/down device drive strength is obtained which reduces the time for tripping a state change of the circuitry being driven by the level shifter mechanism.

Figure 3:
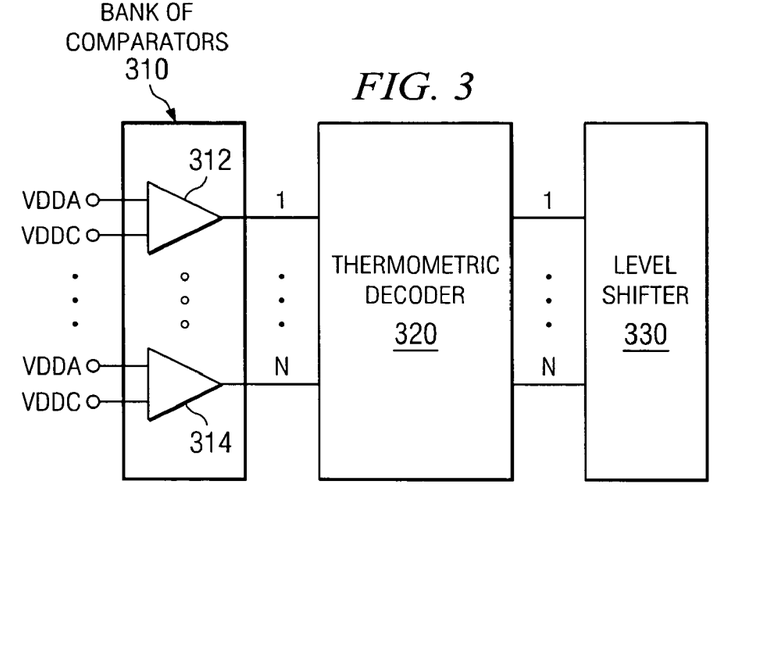
FIG. 3 is an exemplary block diagram illustrating a level shifter circuit in accordance with an illustrative embodiment.

FIG. 3 is an exemplary block diagram illustrating a level shifter circuit in accordance with an illustrative embodiment. As shown in FIG. 3, the level shifter mechanism of the illustrative embodiment includes a bank of N comparators 310, a thermometric decoder 320, and a level shifter 330. Each comparator 312-314 in the bank of N comparators 310 receives a voltage signal VDDA from a first power domain and a voltage signal VDDC from a second power domain. The first power domain may be, for example, a power domain having circuitry that is driving circuitry in the second power domain, with the level shifter mechanism of the illustrative embodiment converting an input voltage signal from the first power domain to an output voltage signal in the second power domain.

Each comparator 312-314 in the bank of N comparators 310 has an associated threshold build into the comparator. If a difference between VDDA and VDDC is greater than the threshold associated with the comparator, then the comparator's output signal switches state, i.e. from low to high. These thresholds may be monotonically increasing with each comparator in the bank of N comparators 310. Thus, for example, a first comparator 312 may have a threshold X while a last comparator 314 in the bank of N comparators 310 may have a threshold of N*X. Thus, depending upon the voltage difference between VDDA and VDDC, certain ones of the comparators 312-314 will have their outputs change state while other comparators will not have their outputs change state.

The N output signals from the bank of N comparators 310 are provided as inputs to thermometric decoder 320. Thermometric decoder 320 receives these inputs signals and generates N switch control signals for controlling switches in current branches of stages of the level shifter 330. Thus, in the depicted example, the thermometric decoder is an N-to-N thermometric decoder. However, the present invention is not limited to such an embodiment. Rather, depending upon the particular implementation of the present invention, the thermometric decoder 320 may be an N-to-M thermometric decoder in which the number of output switch control signals generated is different than the number of input signals received from the bank of N comparators 310.

The operation of a thermometric decoder is generally known in the art. With the depicted thermometric decoder 320 of the illustrative embodiment, essentially all control bits up to a current control bit, identified by a highest threshold comparator in the N comparator signals, that outputs a signal indicative of a threshold having been exceeded, are set. As a result, when the level shifter 330 circuit receives the N switch control signals, all of the switches in the stages identified by the set control bits are closed thereby enabling that stage's operation on the output signal of the inverter of the level shifter 330. With each comparator 312-314 in the bank of N comparators 310 that outputs a signal indicative of a threshold having been exceeded, another stage in the series of stages in the level shifter 330 is enabled.

The enabling of switches in the current branches of the stages of the level shifter 330 cause various ones of the pull-up/down devices in the stages of the level shifter 330 to drive the output voltage signal of an inverter of the level shifter 330 up or down. That is, the output switch control signals of the thermometric decoder 320 may either close or open switches in a series of stages of the level shifter 330. Each stage in the level shifter 330 may pull-up/down the output voltage of the inverter of the level shifter 330 by an incremental amount. Thus, by enabling the pull-up/down devices of a plurality of stages in the level shifter 330, the output voltage of the inverter of the level shifter 330 may be incrementally, and monotonically, boosted or reduced by application of the drive voltages from the pull-up devices or reduction of the output voltage by enabling a connection to pull-down devices. In this way, the resultant drive strength applied by the pull-up/down devices in the level shifter 330 is either monotonically increased or decreased. Thus, the output generated by the thermometric decoder 320 ensures that drive strengths of the level shifter 330 pull-up/down devices are increased and/or decreased monotonically.

Figure 4:
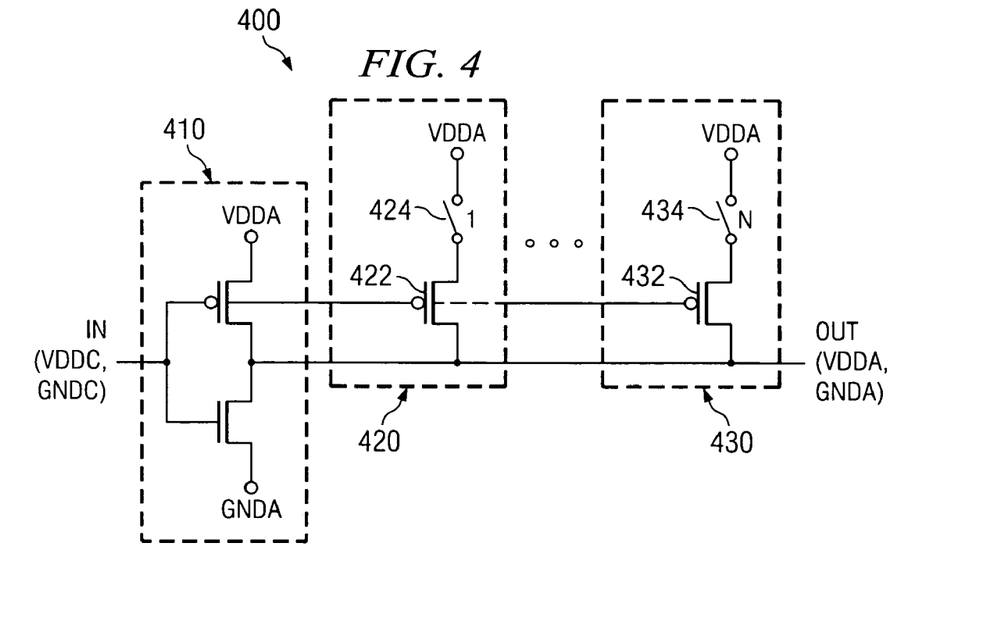
FIG. 4 is an exemplary circuit diagram illustrating a level shifter circuit in which both power domains have a same voltage plane but different ground plane in accordance with one illustrative embodiment.
Figure 5:
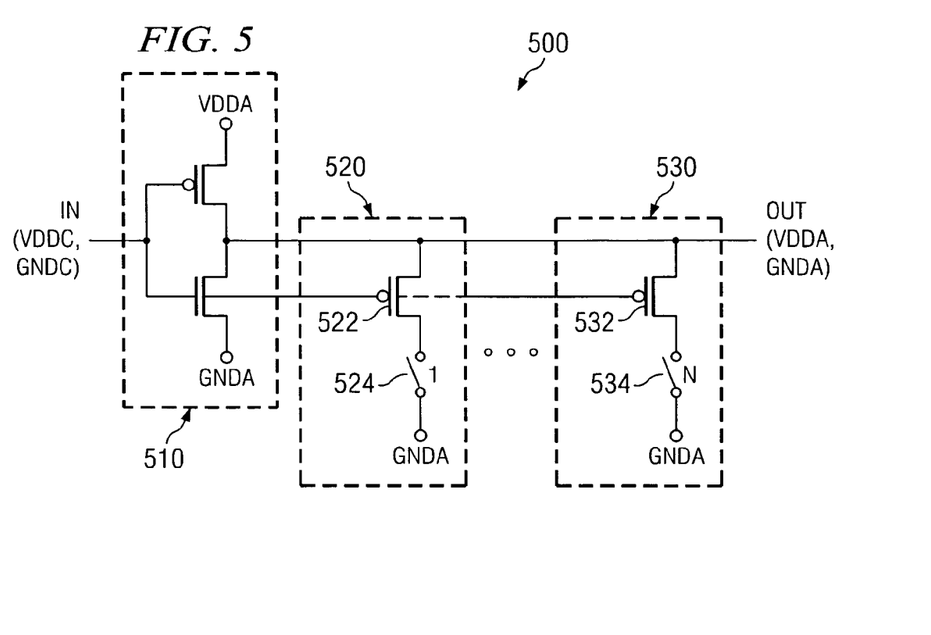
FIG. 5 is an exemplary circuit diagram illustrating a level shifter circuit in which the power domains have a same ground plane but different voltage planes in accordance with one illustrative embodiment.
Figure 6:
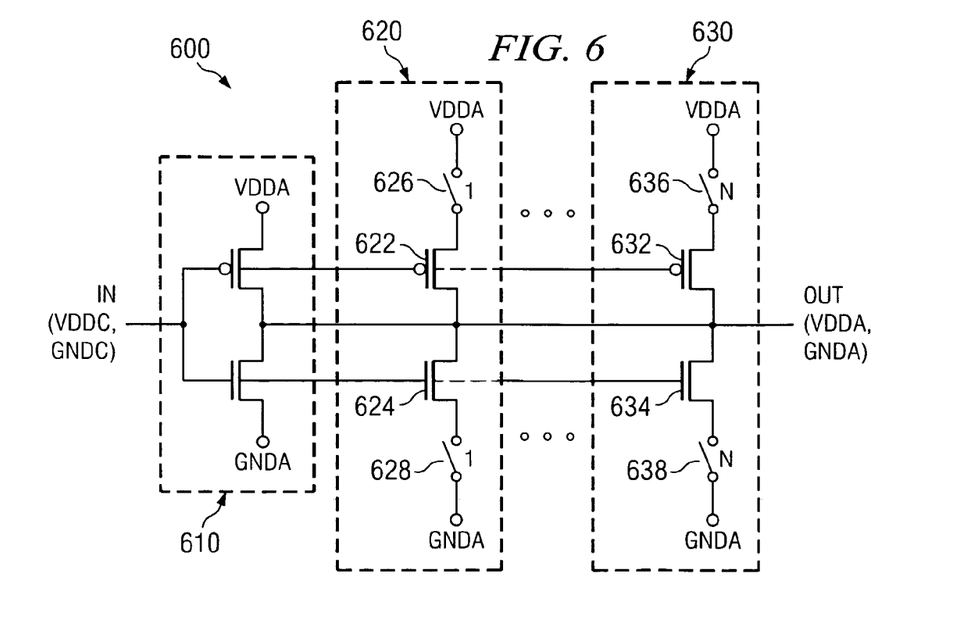
FIG. 6 is an exemplary circuit diagram illustrating a level shifter circuit in which the voltage planes and ground planes in the two power domains are different in accordance with one illustrative embodiment.

The level shifter 330 may take many different forms depending upon the particular implementation requirements for a particular circuit. FIGS. 4-6 provide example level shifter 330 configurations for various situations including situations when both power domains have a same ground plane, both power domains have a same voltage plane, and when the power domains have different voltage and ground planes. In each configuration, however, the level shifter is comprised of an inverter and a series of stages having switches for enabling the stages. These stages receive input signals from the thermometric decoder 320, which generates these input signals based on comparator output signals that compare the voltage of a first power domain to the voltage of a second power domain, to enable the switches of selected stages to thereby monotonically change the output of the inverter. The resulting voltage output signal from the level shifter 330 is provided to the circuitry in the second power domain.

FIG. 4 is an exemplary circuit diagram illustrating a level shifter circuit in which both power domains have a same voltage plane but different ground plane in accordance with one illustrative embodiment. The depicted example circuit operates properly when the GNDA is less than or equal to GNDC. As shown in FIG. 4, the level shifter circuit 400 includes an inverter 410 and a plurality of stages 420-430. Each stage 420-430 shares the same ground as the inverter 410. Thus, each stage 420-430 is comprised of a PFET 422, 432 and a switch 424, 434 which connects the PFET 422, 432 to a voltage source VDDA for the second power domain.

Input signals from the thermometric decoder 320 in FIG. 3, i.e. the output switch control signals, are provided to the switches 424, 434 to open or close the switches. As shown in FIG. 4, each stage 420-430 receives a different input signal from the thermometric decoder 320. The stages 420-430 and input signal lines are arranged such that the stages may be enabled in series to achieve a particular amount of monotonically increasing/decreasing change in the output voltage signal from the inverter 410. Whether or not a particular switch 424, 434 is opened or closed, and thus the stage is enabled or not enabled, is dependent upon the results of the comparison of the voltage difference between the power domains to the monotonically increasing thresholds of the comparators 312-314, as processed by the thermometric decoder 320. Thus, if output switch control signals 1 to 5 from the thermometric decoder 320 are high, and the other output switch control signals 6 to N are low, then the first 5 stages after the inverter 410 are enabled and stages 6 to N are not enabled.

Each stage 420-430 incrementally, and monotonically, modifies the voltage output signal from the inverter 410. Thus, for example, the voltage output signal from the inverter 410 may be boosted by each enabled stage 420-430 to thereby reduce the T_TRIP value and increase the maximum operating frequency FMAX, as previously discussed above. In this way, the level shifter circuit 400 solves the problems associated with duty cycle distortion and maximum operating frequency experienced by prior art mechanisms.

FIG. 5 is an exemplary circuit diagram illustrating a level shifter circuit in which the power domains have a same ground plane but different voltage planes in accordance with one illustrative embodiment. The exemplary circuitry of FIG. 5 operates properly when VDDA is greater than or equal to VDDC. The level shifter circuit 500 of FIG. 5 is configured in a similar manner as the level shifter 400 in FIG. 4 except that the stages 520-530 in this level shifter circuit 500 are comprised of NFETs 522, 532 and switches 524, 534 rather than PFETs. This is because each of the power domains share a same ground plane but has different voltage planes and thus, each of the stages share the same power source VDDA with the inverter 510. The operation of this circuit is similar to that of FIG. 4 in that individual switches may be closed or opened based on the resulting outputs of the comparators 312-314 as processed by the thermometric decoder 320.

FIG. 6 is an exemplary circuit diagram illustrating a level shifter circuit in which the voltage planes and ground planes in the two power domains are different in accordance with one illustrative embodiment. The exemplary circuitry shown in FIG. 6 operates properly for any arbitrary VDDA, VDDC, GNDA and GNDC. The level shifter circuit 600 in FIG. 6 is similar to a combination of level shifter circuits 400 and 500 in that each stage 620-630 of the level shifter circuit 600 includes both a PFET 622, 632 and an NFET 624, 634. This is because the power domains do not share either a voltage plane or a ground plane. In this embodiment, each stage 620-630 includes two switches 626, 628, and 636, 638 for coupling the PFETs 622, 632 and NFETs 624, 634 to voltage source VDDA and ground GNDA, respectively. The input signals from the thermometric decoder 320 are provided to both switches in the stage 620-630 so as to enable the stage 620-630.

Figure 7:
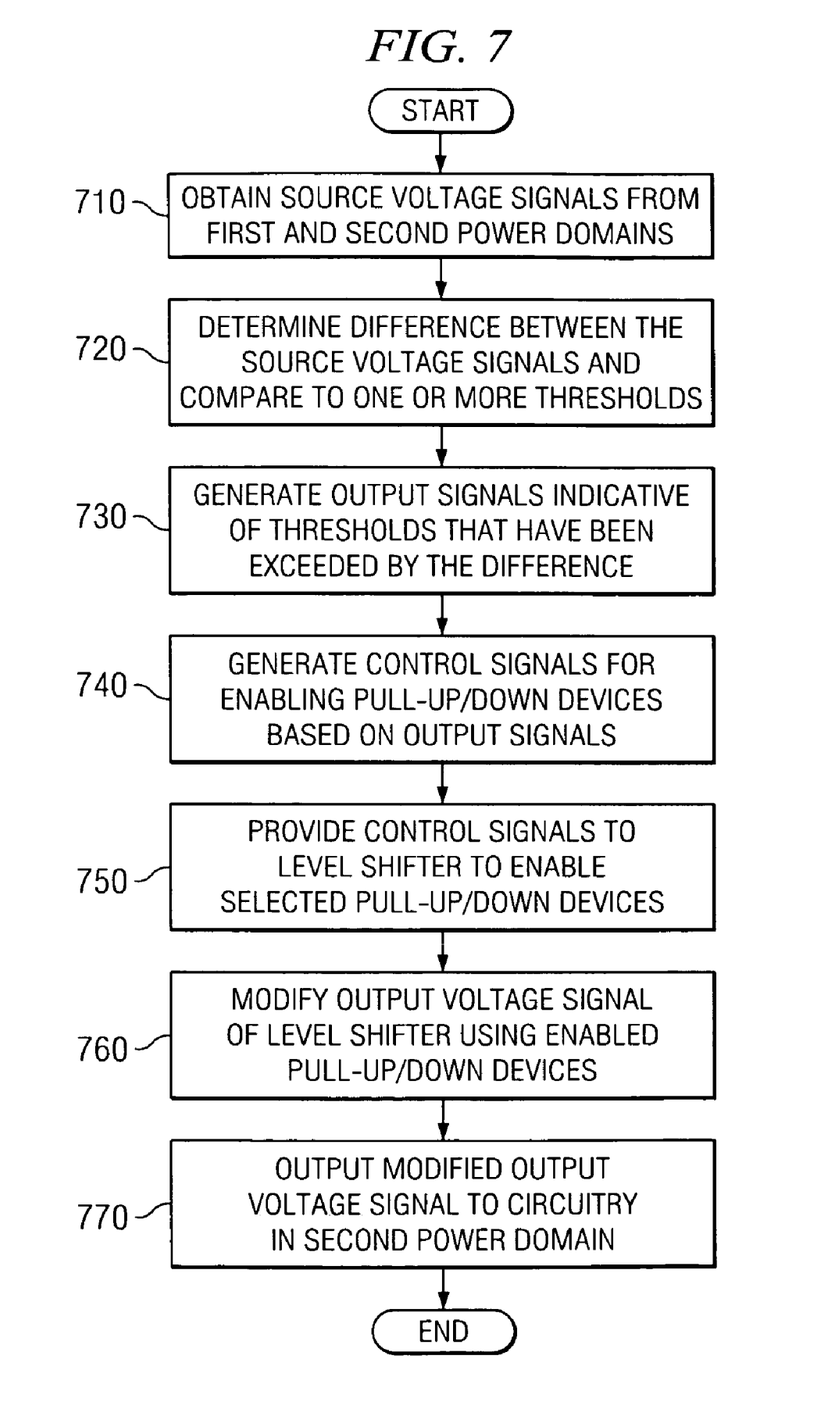
FIG. 7 is a flowchart illustrating an exemplary operation of one illustrative embodiment.

FIG. 7 is a flowchart illustrating an exemplary operation of one illustrative embodiment. As shown in FIG. 7, the operation starts by obtaining the source voltage signals from the first power domain and the second power domain (step 710). One or more comparators are used to generate a difference between the source voltage signals and compare the difference to one or more thresholds (step 720). In one exemplary embodiment, a plurality of monotonically increasing thresholds are utilized. Based on results of the comparison, for those thresholds that are exceeded, corresponding comparators generate an output signal indicative of the threshold having been exceeded (step 730).

These output signals are then provided to a decoder that generates control signals based on the output signals for enabling pull-up/down devices (step 740). The control signals are provided to a level shifter having the pull-up/down devices such that selected ones of the pull-up/down devices are enabled by the control signals (step 750). The enabled pull-up/down devices operate on an output voltage signal of the level shifter to modify the output voltage signal monotonically (step 760). The resulting modified output voltage signal is then provided to circuitry in the second power domain (step 770). The operation then terminates.

Figure 8:
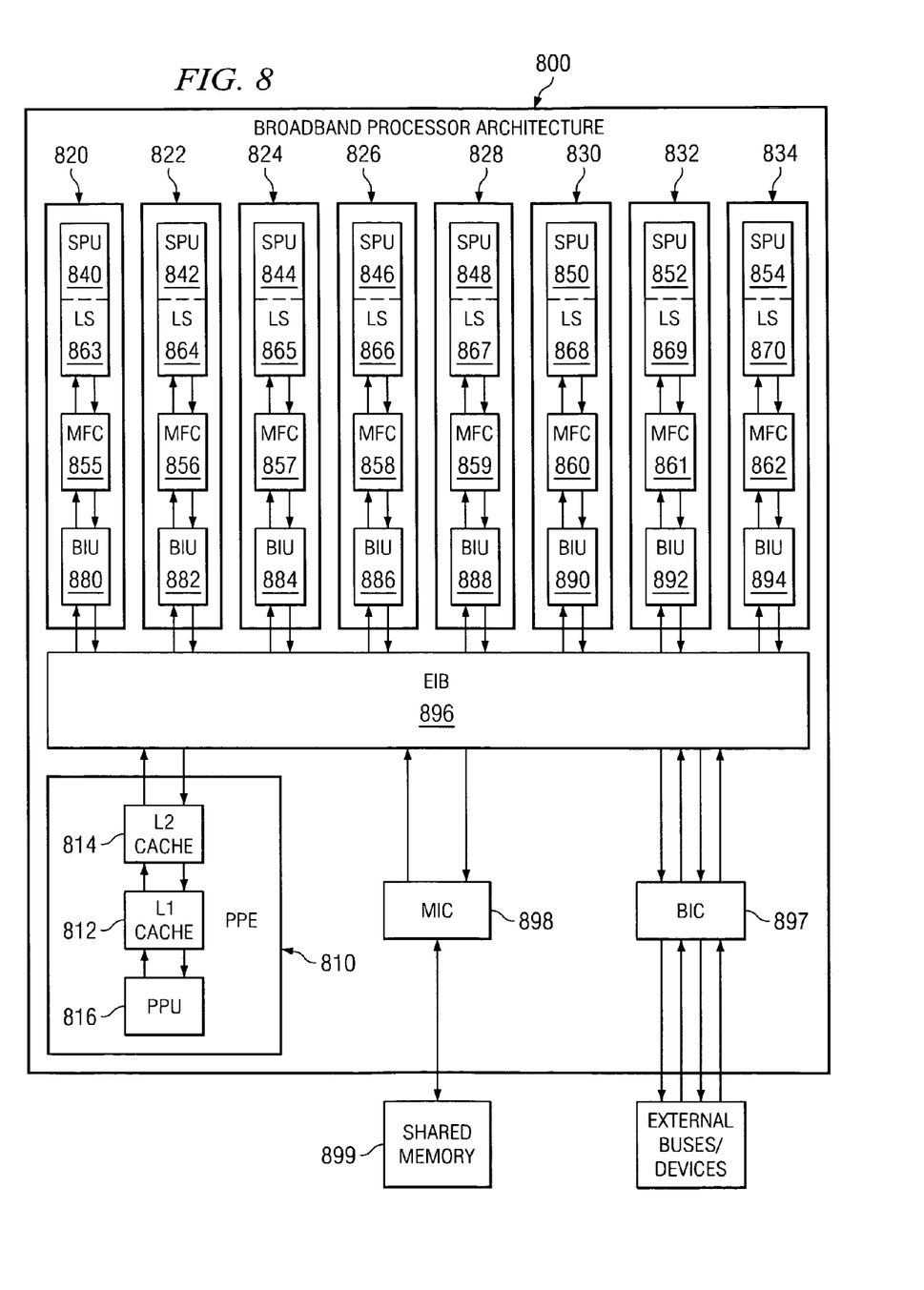
FIG. 8 is an exemplary diagram of a Cell Broadband Engine (CBE) based data processing system in which the level shifter mechanism of the illustrative embodiments may be implemented.

The illustrative embodiments provide an integrated circuit apparatus and method for performing level shifting between two power domains while minimizing duty cycle distortion and increasing a maximum operational frequency of the circuitry. The mechanisms of the illustrative embodiments may be implemented in any integrated circuit device in which two or more power domains are present. Multiple power domains may be found in, for example, state of the art microprocessors and systems-on-a-chip. One exemplary microprocessor in which the aspects of the illustrative embodiments may be implemented is the Cell Broadband Engine (CBE) architecture microprocessor available from International Business Machines Corporation of Armonk, N.Y. An example block diagram of a CBE architecture microprocessor is shown in FIG. 8, discussed hereafter. While the illustrative embodiment may be implemented in the CBE architecture microprocessor, the present invention is not limited to such. As mentioned above, the present invention has application to any integrated circuit device in which a multiple power domains are present and level shifting is required for proper operation of the circuitry of the integrated circuit device.

FIG. 8 is an exemplary block diagram of a data processing system in which aspects of the illustrative embodiments may be implemented. The exemplary data processing system shown in FIG. 8 is an example of the Cell Broadband Engine (CBE) data processing system. While the CBE will be used in the description of the illustrative embodiment, the present invention is not limited to such, as will be readily apparent to those of ordinary skill in the art upon reading this description.

As shown in FIG. 8, the CBE 100 includes a power processor element (PPE) 810 having a processor (PPU) 816 and its L1 and L2 caches 812 and 814, and multiple synergistic processor elements (SPEs) 820-834 that each has its own synergistic processor unit (SPU) 840-854, memory flow control 855-862, local memory or store (LS) 863-870, and bus interface unit (BIU unit) 880-894 which may be, for example, a combination direct memory access (DMA), memory management unit (MMU), and bus interface unit. A high bandwidth internal element interconnect bus (EIB) 896, a bus interface controller (BIC) 897, and a memory interface controller (MIC) 898 are also provided.

The CBE 800 may be a system-on-a-chip such that each of the elements depicted in FIG. 8 may be provided on a single microprocessor chip. Moreover, the CBE 800 is a heterogeneous processing environment in which each of the SPUs may receive different instructions from each of the other SPUs in the system. Moreover, the instruction set for the SPUs is different from that of the PPU, e.g., the PPU may execute Reduced Instruction Set Computer (RISC) based instructions while the SPU execute vectorized instructions.

The SPEs 820-834 are coupled to each other and to the L2 cache 814 via the EIB 896. In addition, the SPEs 820-834 are coupled to MIC 898 and BIC 897 via the EIB 896. The MIC 898 provides a communication interface to shared memory 899. The BIC 897 provides a communication interface between the CBE 800 and other external buses and devices.

The PPE 810 is a dual threaded PPE 810. The combination of this dual threaded PPE 810 and the eight SPEs 820-834 makes the CBE 800 capable of handling 10 simultaneous threads and over 128 outstanding memory requests. The PPE 810 acts as a controller for the other eight SPEs 820-834 which handle most of the computational workload. The PPE 810 may be used to run conventional operating systems while the SPEs 820-834 perform vectorized floating point code execution, for example.

The SPEs 820-834 comprise a synergistic processing unit (SPU) 840-854, memory flow control units 855-862, local memory or store 860-874, and an interface unit 880-894. The local memory or store 860-874, in one exemplary embodiment, comprises a 256 KB instruction and data memory which is visible to the PPE 810 and can be addressed directly by software.

The PPE 810 may load the SPEs 820-834 with small programs or threads, chaining the SPEs together to handle each step in a complex operation. For example, a set-top box incorporating the CBE 800 may load programs for reading a DVD, video and audio decoding, and display, and the data would be passed off from SPE to SPE until it finally ended up on the output display. At 4 GHz, each SPE 820-834 gives a theoretical 32 GFLOPS of performance with the PPE 810 having a similar level of performance.

The memory flow control units (MFCs) 855-862 serve as an interface for an SPU to the rest of the system and other elements. The MFCs 855-862 provide the primary mechanism for data transfer, protection, and synchronization between main storage and the local storages 860-874. There is logically an MFC for each SPU in a processor. Some implementations can share resources of a single MFC between multiple SPUs. In such a case, all the facilities and commands defined for the MFC must appear independent to software for each SPU. The effects of sharing an MFC are limited to implementation-dependent facilities and commands.

In the architecture shown above, the mechanisms of the illustrative embodiments may be used to perform level shifting between any two power domains present in the architecture. For example, the circuitry of the illustrative embodiments may be provided so as to perform level shifting between the power domains of the PPE 810 and the various SPEs 820-834 of the CELL Broadband Engine architecture. Moreover, the level shifting mechanisms of the illustrative embodiments may be used perform level shifting between the power domains of the SPUs 840-854 and one or more PLLs (not shown) provided on the CELL Broadband Engine architecture chip. The level shifter mechanisms of the illustrative embodiments may be used anywhere on the microprocessor or system-on-a-chip where two power domains are present and level shifting is required in order to ensure proper operation of the units in the two power domains.

Thus, the illustrative embodiments provide a mechanism for performing level shifting between two power domains in such a manner that the level shifting may minimize duty cycle distortion as well as eliminate the limit on operating frequency introduced as a result of the VDDA–VDDC voltage mismatches. The mechanisms of the illustrative embodiments increase maximum operating frequency by reducing the time, T_TRIP, required to achieve a voltage having a level that causes a state change in a driven circuit.

The circuit as described above may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

The description of the illustrative embodiments has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. An apparatus, comprising:
   at least one comparator that compares a difference between a source voltage of a first power domain and a source voltage of a second power domain, to at least one threshold built into the at least one comparator; and
   a level shifter coupled to the at least one comparator, wherein the level shifter includes an inverter and at least one stage that operates on a voltage output of the inverter when enabled, wherein the at least one comparator outputs at least one signal indicative of whether the at least one threshold is exceeded by the difference, and wherein the at least one signal is used to control enabling of the at least one stage of the level shifter.

2. The apparatus of claim 1, further comprising:
   a thermometric decoder coupled to the at least one comparator and the level shifter, wherein the thermometric decoder decodes the at least one signal from the at least one comparator and generates at least one control signal for controlling enabling of the at least one stage of the level shifter.

3. The apparatus of claim 2, wherein the thermometric decoder is an N-to-N thermometric decoder.

4. The apparatus of claim 2, wherein the at least one control signal controls at least one switch in the at least one stage of the level shifter to thereby either enable or disable the at least one stage.

5. The apparatus of claim 1, wherein each stage in the at least one stage of the level shifter includes a PFET device and a switch coupling the PFET device to the source voltage of the second power domain.

6. The apparatus of claim 1, wherein each stage in the at least one stage of the level shifter includes a NFET device and a switch coupling the NFET device to a ground of the second power domain.

7. The apparatus of claim 1, wherein each stage in the at least one stage of the level shifter includes:
   a PFET device and a first switch coupling the PFET device to the source voltage of the second power domain; and
   a NFET device and a second switch coupling the NFET device to a ground of the second power domain.

8. The apparatus of claim 1, wherein the at least one comparator comprises a plurality of comparators, and wherein the thresholds built-in to the plurality of comparators are monotonically increasing from a first threshold associated with a first comparator in the plurality of comparators to a last threshold associated with a last comparator in the plurality of comparators.

9. The apparatus of claim 1, wherein the at least one stage includes at least one of a pull-up device or a pull-down device that, when enabled, drives the output voltage signal of the inverter to either increase or decrease, respectively, the output voltage signal.

10. The apparatus of claim 1, wherein each stage in the at least one stage modifies the output voltage signal of the inverter by a monotonically incremental amount.

11. The apparatus of claim 1, wherein the apparatus is part of an integrated circuit device.

12. The apparatus of claim 11, wherein the integrated circuit device is part of a data processing system.

13. The apparatus of claim 12, wherein the data processing system is one of a toy, a game machine, a game console, a hand-held computing device, a personal digital assistant, a communication device, a wireless telephone, a laptop computing device, a desktop computing device, and a server computing device.

14. A method, in a data processing device, comprising:
   comparing, using at least one comparator, a difference between a source voltage of a first power domain and a source voltage of a second power domain, to at least one threshold; and
   controlling enabling of at least one stage in a level shifter coupled to the at least one comparator based on results of the comparing indicating that at least one threshold of the at least one threshold is exceeded by the difference, wherein the level shifter includes an inverter, and wherein each stage in the at least one stage operates on an output of the inverter when enabled.

15. The method of claim 14, further comprising:
   decoding signals output by the at least one comparator; and
   generating at least one control signal for controlling enabling of the at least one stage of the level shifter.

16. The method of claim 15, wherein controlling enabling of the at least one stage of the level shifter comprises controlling at least one switch in the at least one stage of the level shifter to thereby either enable or disable the at least one stage.

17. The method of claim 14, wherein the at least one comparator comprises a plurality of comparators, and wherein the at least one threshold comprises thresholds built-in to the plurality of comparators, wherein the thresholds are monotonically increasing from a first threshold associated with a first comparator in the plurality of comparators to a last threshold associated with a last comparator in the plurality of comparators.

18. The method of claim 14, wherein the at least one stage includes at least one of a pull-up device or a pull-down device that, when enabled, drives the output voltage signal of the inverter to either increase or decrease, respectively, an output voltage signal of the inverter.

19. The method of claim 14, wherein each stage in the at least one stage modifies an output voltage signal of the inverter by a monotonically incremental amount.

20. The method of claim 14, wherein the data processing device is part of a toy, a game machine, a game console, a hand-held computing device, a personal digital assistant, a communication device, a wireless telephone, a laptop computing device, a desktop computing device, or a server computing device.

* * * * *